United States Patent
Arima et al.

(10) Patent No.: US 11,626,522 B2
(45) Date of Patent: Apr. 11, 2023

(54) SCHOTTKY BARRIER DIODE

(71) Applicants: TDK Corporation, Tokyo (JP); TAMURA CORPORATION, Tokyo (JP); Novel Crystal Technology, Inc., Saitama (JP)

(72) Inventors: Jun Arima, Tokyo (JP); Jun Hirabayashi, Tokyo (JP); Minoru Fujita, Tokyo (JP); Kohei Sasaki, Saitama (JP)

(73) Assignees: TDK CORPORATION, Tokyo (JP); TAMURA CORPORATION, Tokyo (JP); NOVEL CRYSTAL TECHNOLOGY, INC., Saitama (JP)

( * ) Notice: Subject to any disclaimer, the term of this patent is extended or adjusted under 35 U.S.C. 154(b) by 87 days.

(21) Appl. No.: 16/758,790

(22) PCT Filed: Sep. 26, 2018

(86) PCT No.: PCT/JP2018/035645
§ 371 (c)(1),
(2) Date: Apr. 23, 2020

(87) PCT Pub. No.: WO2019/082580
PCT Pub. Date: May 2, 2019

(65) Prior Publication Data
US 2021/0167225 A1   Jun. 3, 2021

(30) Foreign Application Priority Data
Oct. 26, 2017 (JP) .............. JP2017-206978

(51) Int. Cl.
*H01L 29/06* (2006.01)
*H01L 29/872* (2006.01)
*H01L 29/24* (2006.01)

(52) U.S. Cl.
CPC ...... *H01L 29/8725* (2013.01); *H01L 29/0611* (2013.01); *H01L 29/0684* (2013.01); *H01L 29/24* (2013.01)

(58) Field of Classification Search
CPC combination set(s) only.
See application file for complete search history.

(56) References Cited

U.S. PATENT DOCUMENTS

2010/0289075 A1* 11/2010 Lin ............... H01L 29/8725
                                                    257/334
2014/0239452 A1*  8/2014 Sasaki ............ H01L 29/045
                                                    257/613

(Continued)

FOREIGN PATENT DOCUMENTS

| CN | 103258861 A | 8/2013 |
| JP | 2017-045969 A | 3/2017 |
| WO | 2016/013554 A1 | 1/2016 |

OTHER PUBLICATIONS

K. Sasaki et al., "Ga2O3 Schottky Barrier Diode with Trench MOS Structure", Proceedings of the 64th Japan Society of Applied Physics Spring Meeting, Mar. 1, 2017, 12-169.

(Continued)

*Primary Examiner* — Moin M Rahman
(74) *Attorney, Agent, or Firm* — McDermott Will & Emery LLP

(57) ABSTRACT

A Schottky barrier diode includes a semiconductor substrate made of gallium oxide, a drift layer made of gallium oxide and provided on the semiconductor substrate, an anode electrode brought into Schottky contact with the drift layer, and a cathode electrode brought into ohmic contact with the semiconductor substrate. The drift layer has a plurality of trenches formed in a position overlapping the anode electrode in a plan view. Among the plurality of trenches, a trench positioned at the end portion has a selectively (Continued)

increased width. Thus, the curvature radius of the bottom portion of the trench is increased, or an edge part constituted by the bottom portion as viewed in a cross section is divided into two parts. As a result, an electric field to be applied to the bottom portion of the trench positioned at the end portion is mitigated, making dielectric breakdown less likely to occur.

20 Claims, 9 Drawing Sheets

(56) References Cited

U.S. PATENT DOCUMENTS

| | | | |
|---|---|---|---|
| 2015/0228809 A1* | 8/2015 | Sugiura | H01L 29/66143 257/485 |
| 2015/0333133 A1 | 11/2015 | Boettcher et al. | |
| 2016/0211257 A1* | 7/2016 | Yoshida | H01L 29/7397 |
| 2016/0254357 A1 | 9/2016 | Aketa | |
| 2016/0260809 A1* | 9/2016 | Hirler | H01L 29/7813 |
| 2017/0040423 A1* | 2/2017 | Inoue | H01L 29/78 |
| 2020/0066921 A1* | 2/2020 | Sasaki | H01L 29/8725 |

OTHER PUBLICATIONS

International Search Report issued in corresponding International Patent Application No. PCT/JP2018/035645, dated Dec. 4, 2018, with English translation.

K. Sasaki et al., "First Demostration of Ga2O3 Trench MOS-Type Schottky Barrier Diodes", IEEE Electron Device Letters, IEEE, vol. 38, No. 6, Jun. 1, 2017, pp. 783-785.

Extended European Search Report issued in corresponding European Patent Applicatin No. 18870149.4-1212, dated Jun. 16, 2021.

* cited by examiner

SCHOTTKY BARRIER DIODE

CROSS REFERENCE TO RELATED APPLICATIONS

This application is the U.S. National Phase under 35 U.S.C. § 371 of International Application No. PCT/JP2018/035645, filed on Sep. 26, 2018, which claims the benefit of Japanese Patent Application No. 2017-206978, filed on Oct. 26, 2017, the entire contents of each are hereby incorporated by reference.

TECHNICAL FIELD

The present invention relates to a Schottky barrier diode and, more particularly, to a Schottky barrier diode using gallium oxide.

BACKGROUND ART

A Schottky barrier diode is a rectifying element utilizing a Schottky barrier generated due to bonding between metal and a semiconductor and is lower in forward voltage and higher in switching speed than a normal diode having a PN junction. Thus, the Schottky barrier diode is sometimes utilized as a flyback diode of a switching element.

When the Schottky barrier diode is utilized as a flyback diode of a switching element, it is necessary to ensure a sufficient backward withstand voltage, so that, silicon carbide (SiC), gallium nitride (GaN), or gallium oxide ($Ga_2O_3$) having a larger band gap is sometimes used in place of silicon (Si). Among them, gallium oxide has a very large band gap (4.8 eV to 4.9 eV) and a large breakdown field (about 8 MV/cm), so that a Schottky barrier diode using gallium oxide is very promising as the flyback diode of the switching element. An example of the Schottky barrier diode using gallium oxide is described in Patent Document 1 and Non-Patent Document 1.

In the Schottky barrier diode described in Non-Patent Document 1, a plurality of trenches are formed so as to overlap an anode electrode in a plan view, and the inner wall of each of the trenches is covered with an insulating film. With this structure, when a backward voltage is applied, a mesa region positioned between adjacent trenches becomes a depletion layer, so that a channel region of a drift layer is pinched off. Thus, a leak current upon application of the backward voltage can be significantly reduced.

CITATION LIST

Patent Document

[Patent Document 1] JP 2017-045969 A

Non-Patent Document

[Non-Patent Document 1] $Ga_2O_3$ Schottky Barrier Diode with Trench MOS Structure (The 64th Spring Meeting of the Japan Society of Applied Physics, 2017 [15p-315-13])

SUMMARY OF INVENTION

Problem to be Solved by the Invention

However, in the Schottky barrier diodes described in Patent Document 1 and Non-Patent Document 1, an electric field concentrates on the end portion of the anode electrode, so that when a high voltage is applied, dielectric breakdown occurs in this portion. For example, in the Schottky barrier diodes described in Non-Patent Document 1, an electric field concentrates on an edge part of the trench positioned at the end portion.

It is therefore an object of the present embodiment to provide a Schottky barrier diode using gallium oxide, which is less likely to cause dielectric breakdown due to concentration of an electric field.

Means for Solving the Problem

A Schottky barrier diode according to the present invention includes a semiconductor substrate made of gallium oxide, a drift layer made of gallium oxide and provided on the semiconductor substrate, an anode electrode brought into Schottky contact with the drift layer, and a cathode electrode brought into ohmic contact with the semiconductor substrate. The drift layer has a plurality of trenches formed in a position overlapping the anode electrode in a plan view. Among the plurality of trenches, a trench positioned at the end portion has a selectively increased width.

According to the present invention, the width of the trench positioned at the end portion is increased, so that the curvature radius of the bottom portion of this trench is increased, or an edge part constituted by the bottom portion as viewed in a cross section is divided into two parts. As a result, an electric field to be applied to the bottom portion of the trench positioned at the end portion is mitigated, making dielectric breakdown less likely to occur.

In the present invention, the inner walls of the plurality of trenches may be covered with an insulating film. With this configuration, it is possible to obtain a structure in which the inside of the plurality of trenches are filled with the anode electrode.

The Schottky barrier diode according to the present invention may further include an insulating layer formed on the drift layer, and the anode electrode may be formed on the insulating layer and brought into Schottky contact with the drift layer through an opening formed in the insulating layer. With this configuration, a so-called field plate structure can be obtained, allowing further mitigation of an electric field to be applied to the bottom portion of the trench positioned at the end portion.

Advantageous Effects of the Invention

As described above, according to the present invention, there can be provided a gallium oxide Schottky barrier diode in which dielectric breakdown due to electric field concentration hardly occurs.

BRIEF DESCRIPTION OF DRAWINGS

FIG. 4A is a view illustrating electric field strength in a cross section, and FIG. 4B is a graph illustrating the relationship between a lateral position and the maximum electric field strength.

FIG. 5A is a view illustrating electric field strength in a cross section, and FIG. 5B is a graph illustrating the relationship between a lateral position and the maximum electric field strength.

FIG. 7A is a view illustrating electric field strength in a cross section, and FIG. 7B is a graph illustrating the relationship between a lateral position and the maximum electric field strength.

FIG. 8A is a view illustrating electric field strength in a cross section, and FIG. 8B is a graph illustrating the relationship between a lateral position and the maximum electric field strength.

MODE FOR CARRYING OUT THE INVENTION

Preferred embodiments of the present invention will be explained below in detail with reference to the accompanying drawings.

First Embodiment

Figure 1:
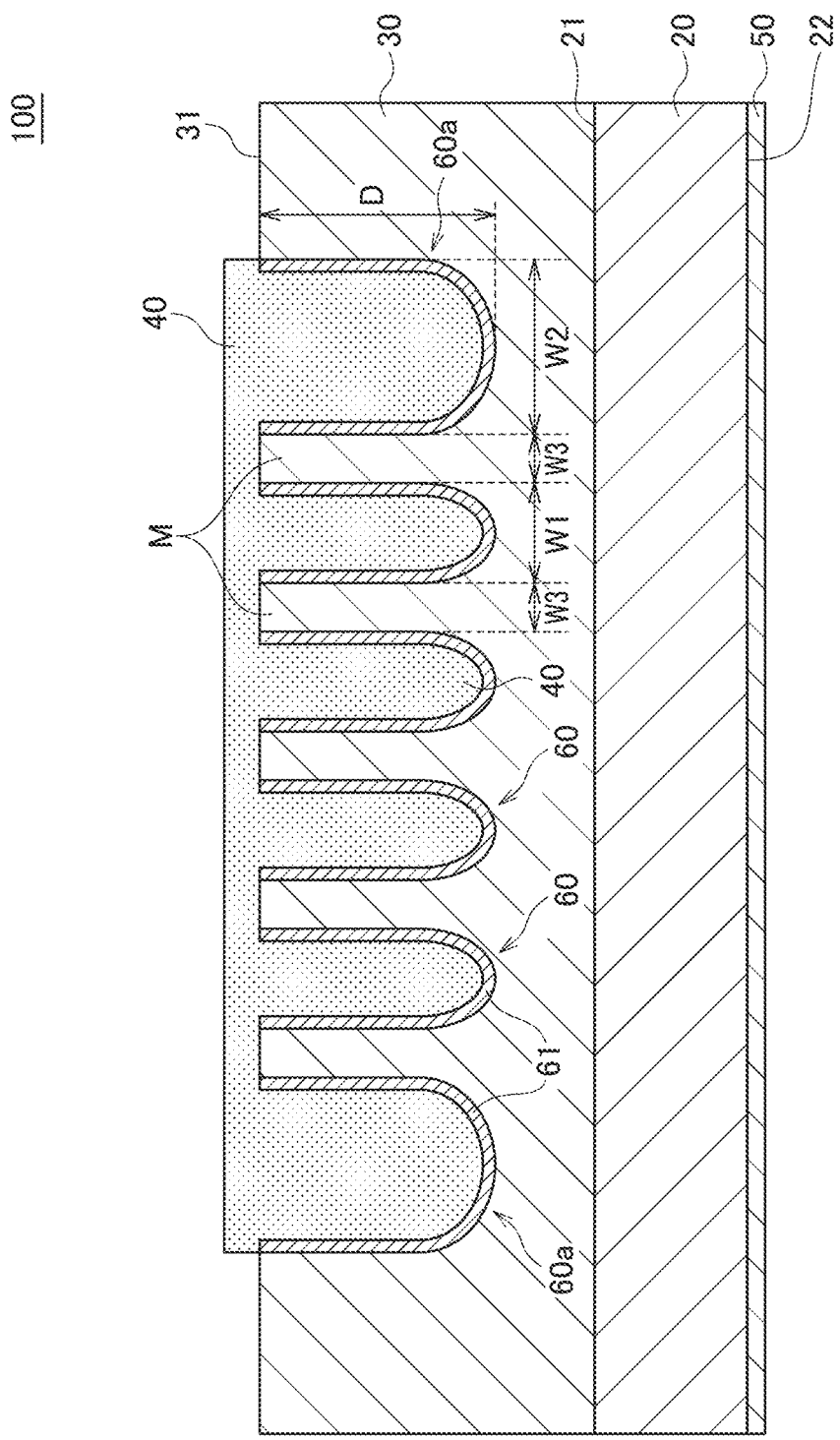
FIG. 1 is a schematic cross-sectional view illustrating the configuration of a Schottky barrier diode 100 according to a first embodiment of the present invention.

FIG. 1 is a schematic cross-sectional view illustrating the configuration of a Schottky barrier diode 100 according to the first embodiment of the present invention.

As illustrated in FIG. 1, the Schottky barrier diode 100 according to the present embodiment has a semiconductor substrate 20 and a drift layer 30, both of which are made of gallium oxide ($\beta$-$Ga_2O_3$). The semiconductor substrate 20 and drift layer 30 are each introduced with silicon (Si) or tin (Sn) as an n-type dopant. The concentration of the dopant is higher in the semiconductor substrate 20 than in the drift layer 30, whereby the semiconductor substrate 20 and the drift layer 30 function as an layer and an n$^-$ layer, respectively.

The semiconductor substrate 20 is obtained by cutting a bulk crystal formed using a melt-growing method, and the thickness thereof is about 250 μm. Although there is no particular restriction on the planar size of the semiconductor substrate 20, the planar size is generally selected in accordance with the amount of current flowing in the element and, when the maximum amount of forward current is about 20 A, the planar size may be set to about 2.4 mm×2.4 mm.

The semiconductor substrate 20 has an upper surface 21 positioned on the upper surface side in a mounted state and a back surface 22 positioned on the lower surface side in a mounted state. The drift layer 30 is formed on the entire upper surface 21. The drift layer 30 is a thin film obtained by epitaxially growing gallium oxide on the upper surface 21 of the semiconductor substrate 20 using a reactive sputtering method, a PLD method, an MBE method, an MOCVD method, or an HVPE method. Although there is no particular restriction on the film thickness of the drift layer 30, the film thickness is generally selected in accordance with the backward withstand voltage of the element and, in order to ensure a withstand voltage of about 600 V, the film thickness may be set to, e.g., about 7 μm.

An anode electrode 40 brought into Schottky contact with the drift layer 30 is formed on an upper surface 31 of the drift layer 30. The anode electrode 40 is formed of metal such as platinum (Pt), palladium (Pd), gold (Au), nickel (Ni), molybdenum (Mo), Copper (Cu) or the like. The anode electrode 40 may have a multilayer structure of different metal films, such as Pt/Au, Pt/Al, Pd/Au, Pd/Al, Pt/Ti/Au, or Pd/Ti/Au. On the other hand, a cathode electrode 50 brought into ohmic contact with the semiconductor substrate 20 is formed on the back surface 22 of the semiconductor substrate 20. The cathode electrode 50 is formed of metal such as titanium (Ti). The cathode electrode 50 may have a multilayer structure of different metal films, such as Ti/Au or Ti/Al.

In the present embodiment, a plurality of trenches 60 are formed in the drift layer 30. Each trench 60 is formed at a position overlapping the anode electrode 40 in a plan view, and the inner wall thereof is covered with an insulating film 61 made of $HfO_2$. The inside of the trench 60 is filled with the same material as the anode electrode 40. In the present embodiment, since the plurality of trenches 60 are formed in the drift layer 30, the anode electrode 40 may be made of a material having a low work function such as molybdenum (Mo) or copper (Cu). Further, since the plurality of trenches 60 are formed in the drift layer 30, the dopant concentration of the drift layer 30 can be increased to about $5 \times 10^{16}$ cm$^{-3}$.

Apart of the drift layer 30 positioned between adjacent trenches 60 constitutes a mesa region M. The mesa region M becomes a depletion layer when a backward voltage is applied between the anode electrode 40 and the cathode electrode 50, so that the channel region of the drift layer 30 is pinched off. This significantly suppresses a leak current upon application of a backward voltage.

In the Schottky barrier diode having such a configuration, an electric field concentrates on the bottom portion of a trench 60a positioned at the end portion, and thus dielectric breakdown is likely to occur at this portion. Considering this, in the Schottky barrier diode 100 according to the present embodiment, the trench width of the trench 60a positioned at the end portion is selectively increased. That is, assuming that the width of the trench 60 that is not positioned at the end portion is W1 and that the width of the trench 60a positioned at the end portion is W2, W1<W2 is satisfied.

The width W1 of the trench 60 that is not positioned at the end portion and width W3 of the mesa region M need to be determined based on electrical characteristics required for the Schottky barrier diode 100 and are therefore difficult to change freely. On the other hand, the width W2 of the trench 60a positioned at the end portion is comparatively freely changed since it has little influence on the electrical characteristics of the Schottky barrier diode 100.

Further, in the Schottky barrier diode 100 according to the present embodiment, the trench width of the trench 60a positioned at the end portion is selectively increased, so that the concentration of an electric field on the trench 60a positioned at the end potion is mitigated as compared to when all the trenches 60 are designed to have the same width (=W1). This is because when the width W2 of the trench 60a positioned at the end portion is increased, the curvature radius of the bottom portion increases, or an edge part constituted by the bottom portion as viewed in cross section is divided into two parts. As a result, dielectric breakdown hardly occurs around the bottom portion of the trench 60a positioned at the end portion.

As described above, the trench width of the trench 60a positioned at the end portion is selectively increased, so that the Schottky barrier diode 100 according to the present embodiment can prevent dielectric breakdown due to electric field concentration. Further, at the time of manufacture, all the trenches 60 including the trench 60a positioned at the end portion can be formed at the same time, preventing the number of manufacturing processes from being increased.

Although the inner wall of the trench 60 is covered with the insulating film 61, and the inside of the trench 60 is filled with the same material as the anode electrode 40 in the present embodiment, the trench 60 may be filled with a semiconductor material of an opposite conductivity type (p-type in the present embodiment) without use of the insulating film 61.

Second Embodiment

Figure 2:
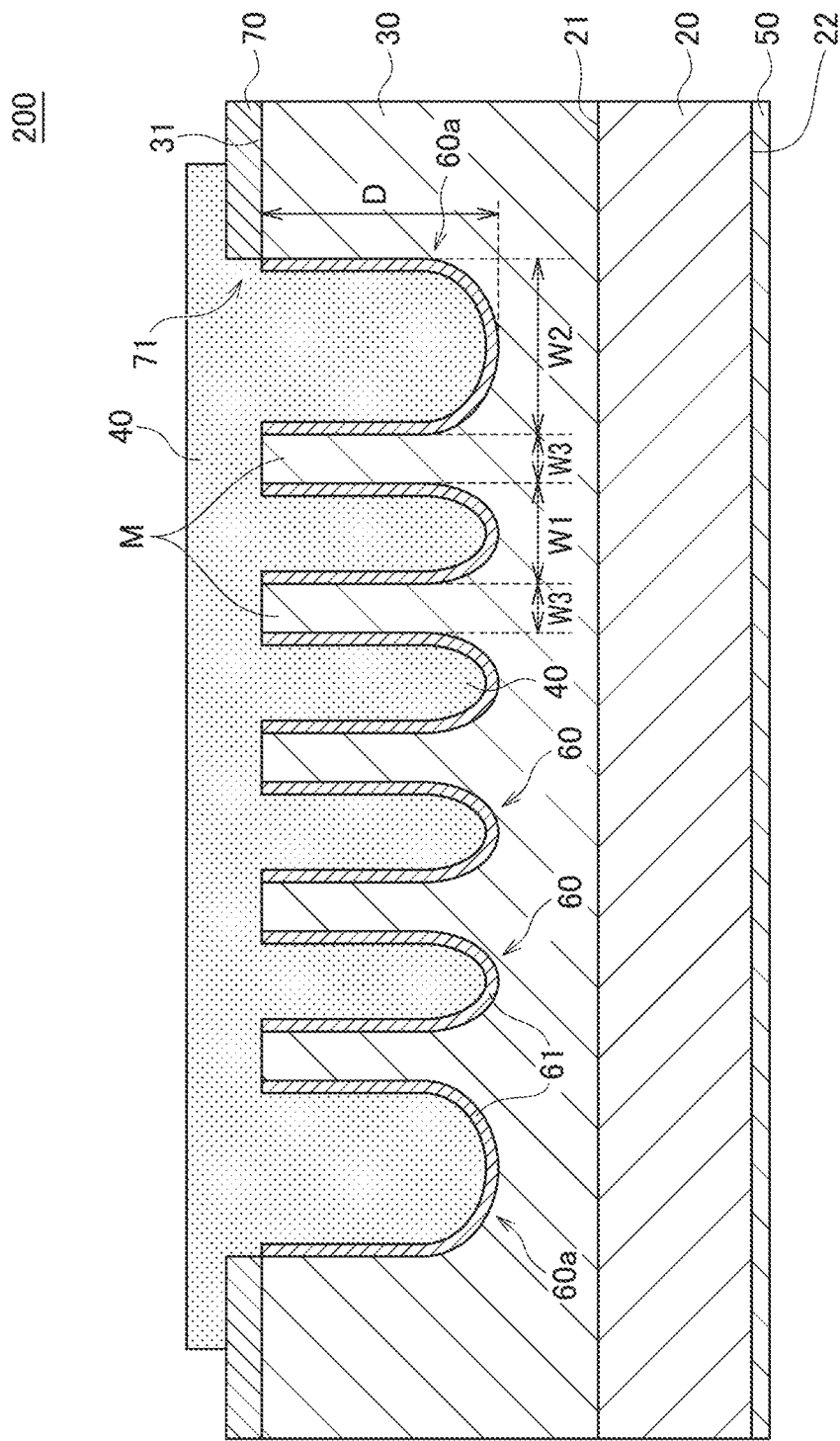
FIG. 2 is a schematic cross-sectional view illustrating the configuration of a Schottky barrier diode 200 according to a second embodiment of the present invention.

FIG. 2 is a schematic cross-sectional view illustrating the configuration of a Schottky barrier diode 200 according to a second embodiment of the present invention.

As illustrated in FIG. 2, the Schottky barrier diode 200 according to the second embodiment differs from the Schottky barrier diode 100 according to the first embodiment in that an insulating layer 70 is formed on the drift layer 30. Other configurations are basically the same as those of the Schottky barrier diode 100 according to the first embodiment, so the same reference numerals are given to the same elements, and overlapping description will be omitted.

The insulating layer 70, which is made of an insulating material such as silicon oxide, is formed so as to cover an upper surface 31 of the drift layer 30 and has an opening 71 through which the trenches 60 are exposed. A part of the anode electrode 40 is formed on the insulating layer 70 and the remaining part thereof is brought into Schottky contact with the drift layer 30 through the opening 71. As a result, a so-called field plate structure can be obtained, allowing further mitigation of an electric field to be applied to the bottom portion of the trench 60a positioned at the end portion.

It is apparent that the present invention is not limited to the above embodiments, but may be modified and changed without departing from the scope and spirit of the invention.

Example 1

A simulation model of Example 1 having the same structure as the Schottky barrier diode 100 illustrated in FIG. 1 was assumed, and electric field strength obtained upon application of a backward voltage between the anode electrode 40 and the cathode electrode 50 was simulated. The dopant concentration of the semiconductor substrate 20 was set to $1 \times 10^{18}$ cm$^{-3}$, and the dopant concentration of the drift layer 30 was set to $5 \times 10^{16}$ cm$^{-3}$. The thickness of the drift layer 30 was set to 7 μm. The depth D and width W1 of the trench 60 were set to 3 μm and 1 μm, respectively, the mesa width W3 of the mesa region M was set to 2 μm, and the insulating film 61 formed on the inner wall of the trench 60 was an HfO$_2$ film having a thickness of 50 nm. The width W2 of the trench 60a positioned at the end portion was set to 10 μm. The anode electrode 40 was made of gold (Au), and the cathode electrode 50 was made of a laminated film of Ti/Au.

Figure 3:
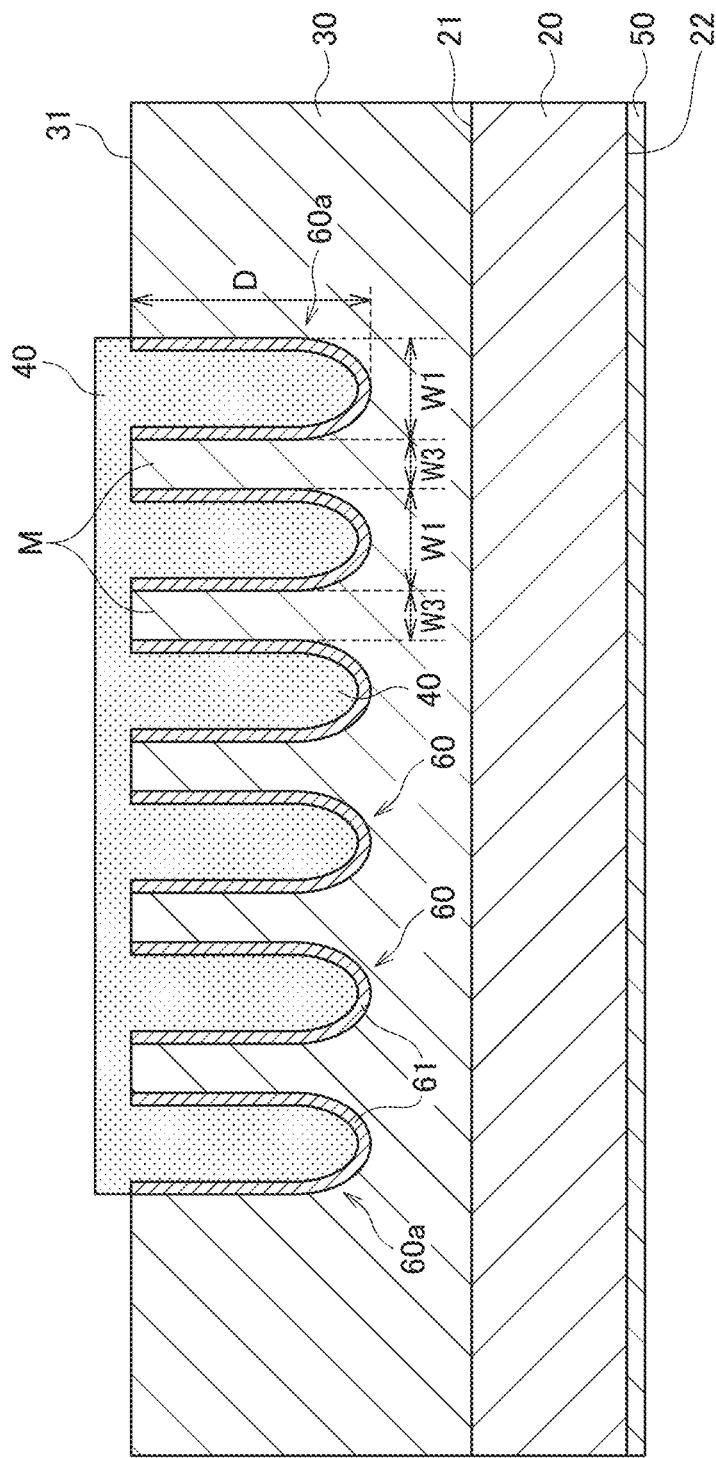
FIG. 3 a schematic cross-sectional view for explaining a structure of a simulation model of Comparative Example 1.

Further, for comparison, as illustrated in FIG. 3, a simulation model of Comparative Example 1 having the same structure as that of Example 1 except that the width of the trench 60a positioned at the end portion was set to be the same as the width W1 of the trench 60 was assumed, and electric field strength obtained upon application of a backward voltage between the anode electrode 40 and the cathode electrode 50 was simulated.

Figure 4A:
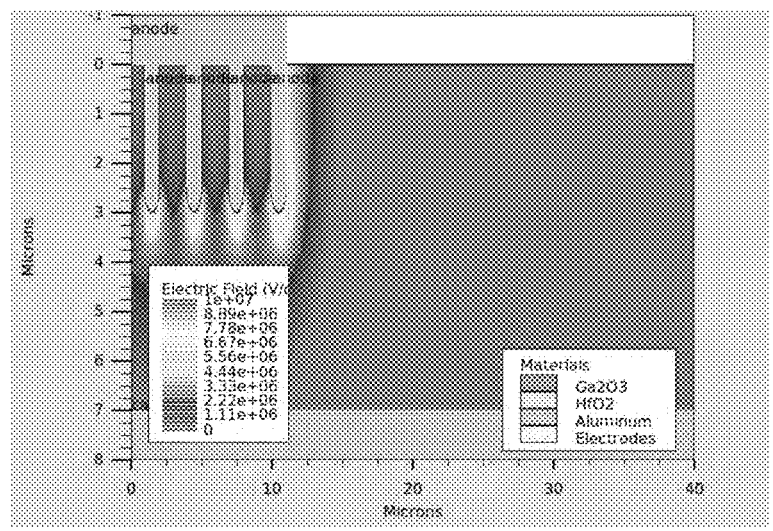
FIGS. 4A and 4B are views each illustrating a simulation result of Comparative Example 1, where
Figure 4B:
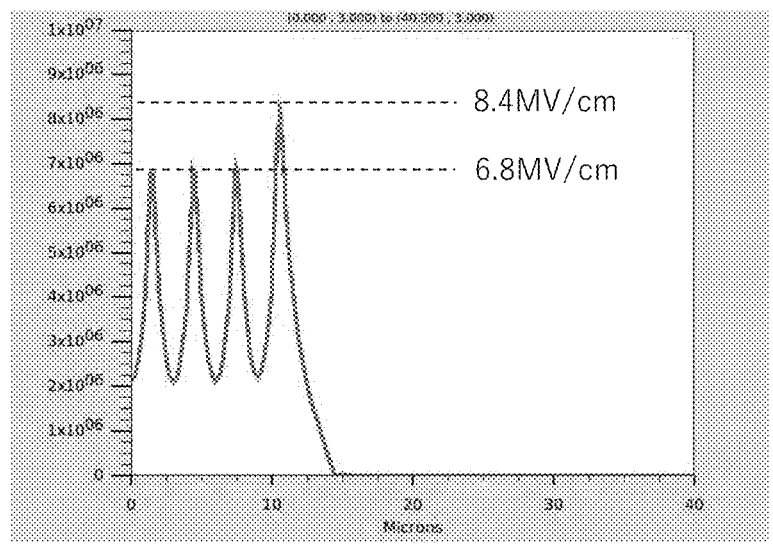

FIGS. 4A and 4B are views each illustrating a simulation result of Comparative Example 1. FIG. 4A is a view illustrating electric field strength in a cross section, and FIG. 4B is a graph illustrating the relationship between a lateral position and the maximum electric field strength. The lateral positions in FIGS. 4A and 4B correspond to each other. As illustrated in FIGS. 4A and 4B, in the simulation model of Comparative Example 1, an electric field concentrated on the bottom portion of the trench 60a positioned at the end portion, and the maximum value thereof was 8.4 MV/cm. This value exceeds 8 MV/cm which is the dielectric breakdown electric field strength of gallium oxide, so that, with this device structure, dielectric breakdown may occur at the bottom portion of the trench 60a, failing to obtain a required withstand voltage.

Figure 5A:
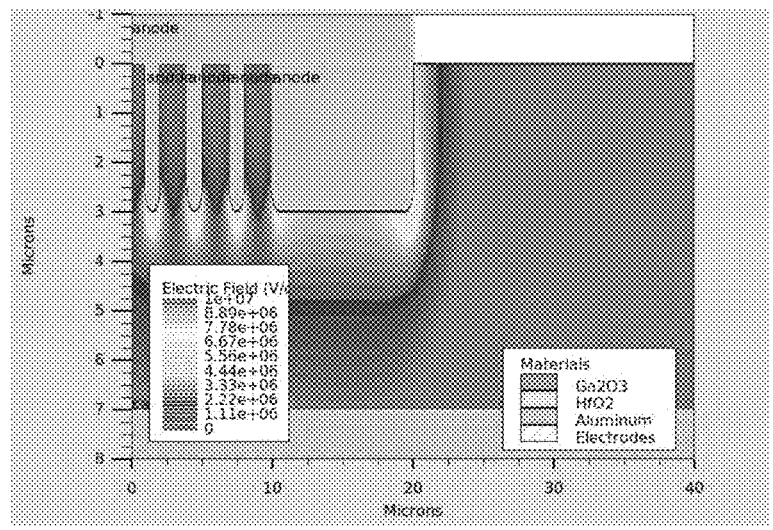
FIGS. 5A and 5B are views each illustrating a simulation result of Example 1, where
Figure 5B:
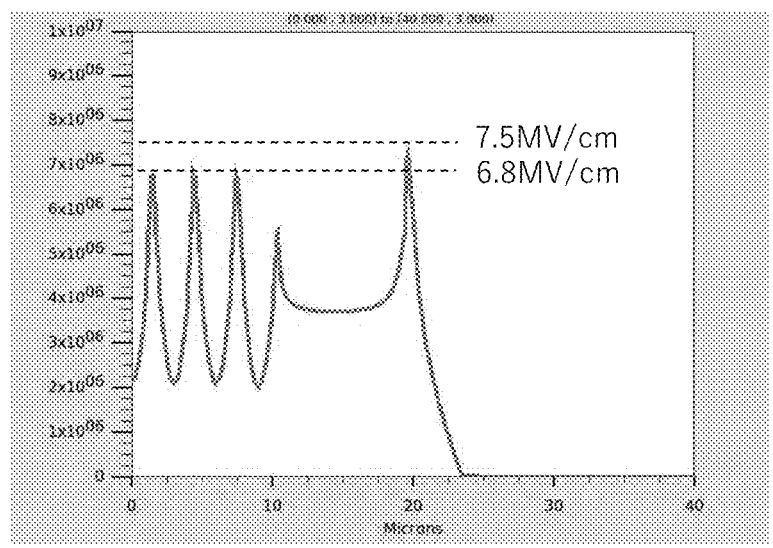

FIGS. 5A and 5B are views each illustrating a simulation result of Example 1. FIG. 5A is a view illustrating electric field strength in a cross section, and FIG. 5B is a graph illustrating the relationship between a lateral position and the maximum electric field strength. The lateral positions in FIGS. 5A and 5B correspond to each other. As illustrated in FIGS. 5A and 5B, in the simulation model of Example 1, as a result of an increase in the width of the trench 60a positioned at the end portion, the edge part on which an electric field concentrated was divided into two parts, dispersing the electric field. This reduced the maximum value of the electric field to 7.5 MV/cm which was equal to or less than the dielectric breakdown electric field strength of gallium oxide. Thus, with this device structure, it is possible to produce a gallium oxide Schottky barrier diode satisfying a required withstand voltage.

Although the electric field concentrated to some extent on the bottom portion of the trench 60 that was not positioned at the end portion, there was no difference between Example 1 and Comparative Example 1 in terms of the value of the electric field, and the maximum value of the electric field was 6.8 MV/cm in both Example 1 and Comparative Example 1.

Example 2

A simulation model of Example 2 having the same structure as that of the Schottky barrier diode 200 illustrated in FIG. 2 was assumed, and electric field strength obtained upon application of a backward voltage between the anode electrode 40 and the cathode electrode 50 was simulated. The insulating layer 70 was made of silicon oxide having a thickness of 300 nm, and a field plate length of 10 μm was set. Other conditions were the same as those for the simulation model of Example 1.

Figure 6:
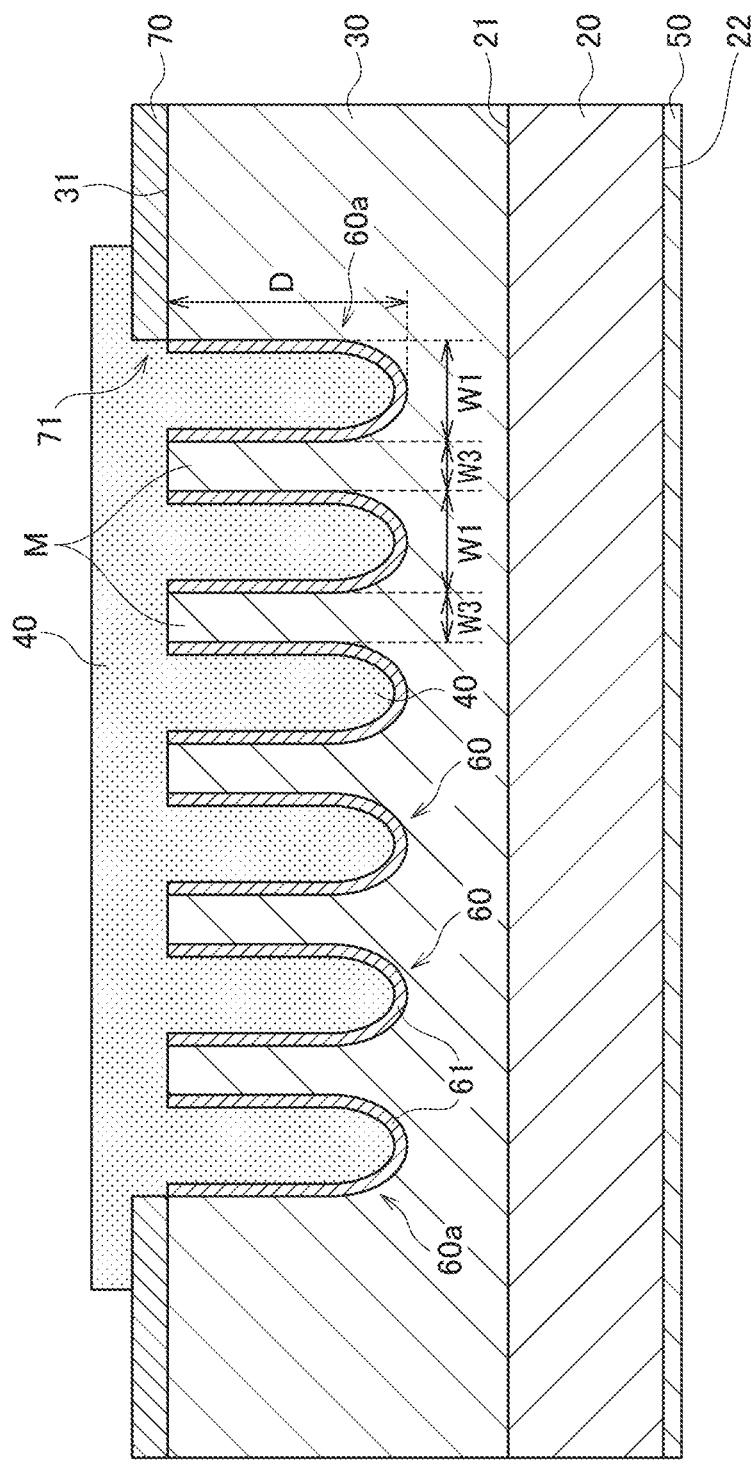
FIG. 6 a schematic cross-sectional view for explaining a structure of a simulation model of Comparative Example 2.

Further, for comparison, as illustrated in FIG. 6, a simulation model of Comparative Example 2 having the same structure as that of Example 2 except that the width of the trench 60a positioned at the end portion was set to be the same as the width W1 of the trench 60 was assumed, and electric field strength obtained upon application of a backward voltage between the anode electrode 40 and the cathode electrode 50 was simulated.

Figure 7A:
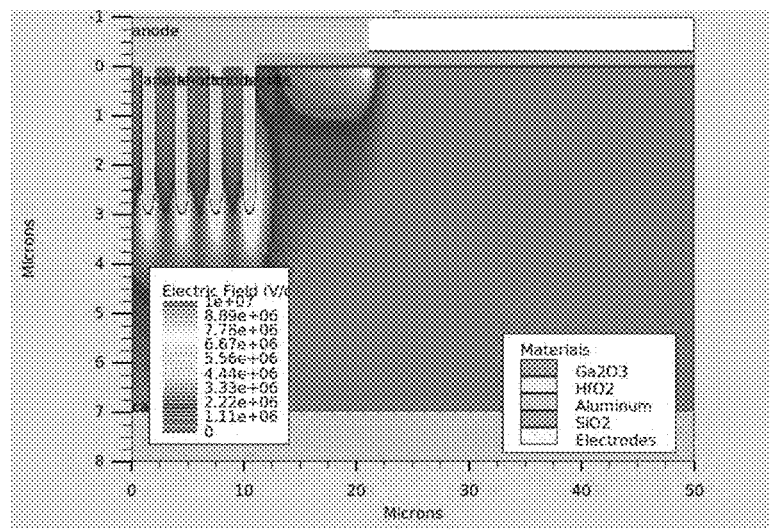
FIGS. 7A and 7B are views each illustrating a simulation result of Comparative Example 2, where
Figure 7B:
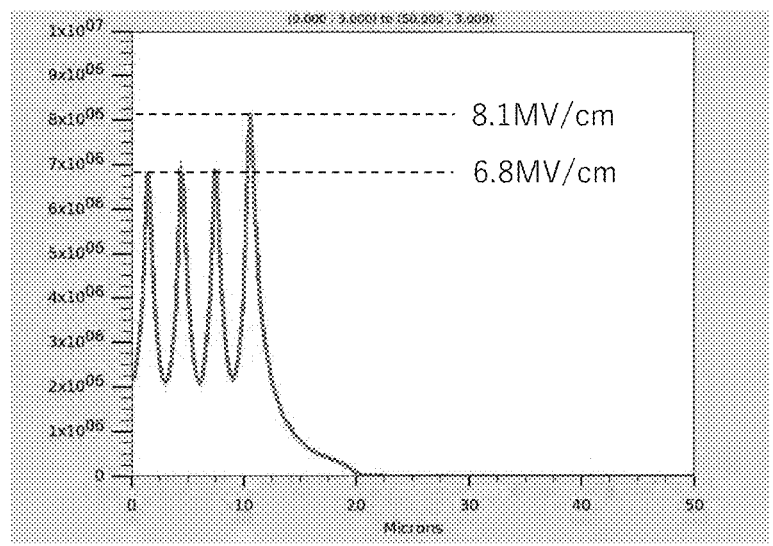

FIGS. 7A and 7B are views each illustrating a simulation result of Comparative Example 2. FIG. 7A is a view illustrating electric field strength in a cross section, and FIG. 7B is a graph illustrating the relationship between a lateral position and the maximum electric field strength. The lateral positions in FIGS. 7A and 7B correspond to each other. As illustrated in FIGS. 7A and 7B, in the simulation model of Comparative Example 2, an electric field concentrated on the bottom portion of the trench 60a positioned at the end portion, and the maximum value thereof was 8.1 MV/cm. Thus, with this device structure, dielectric breakdown may occur at the bottom portion of the trench 60a, failing to obtain a required withstand voltage.

Figure 8A:
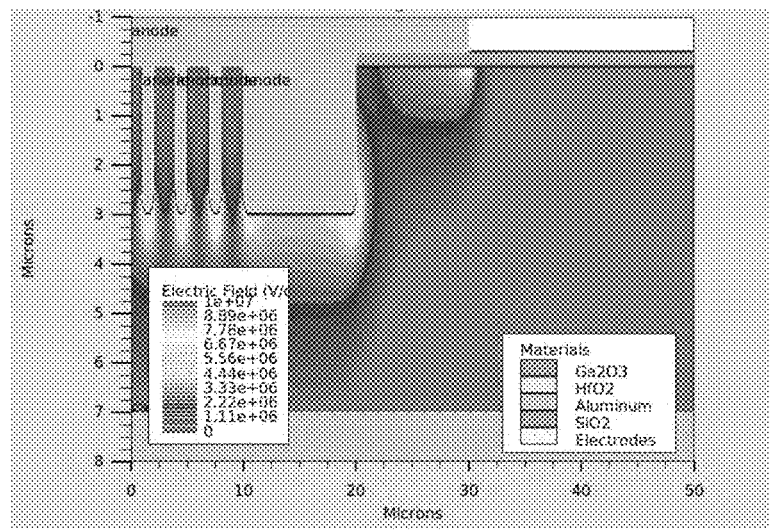
FIGS. 8A and 8B are views each illustrating a simulation result of Example 2, where
Figure 8B:
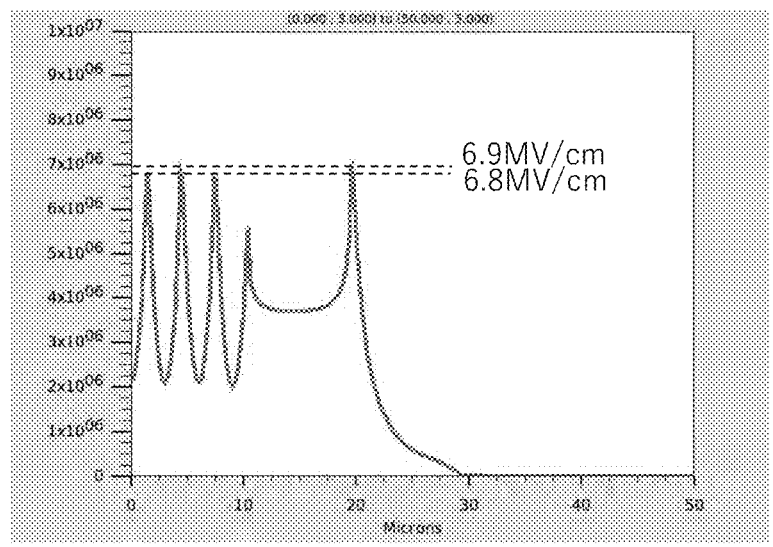

FIGS. 8A and 8B are views each illustrating a simulation result of Example 2. FIG. 8A is a view illustrating electric field strength in a cross section, and FIG. 8B is a graph illustrating the relationship between a lateral position and the maximum electric field strength. The lateral positions in FIGS. 8A and 8B correspond to each other. As illustrated in FIGS. 8A and 8B, in the simulation model of Example 2, as a result of an increase in the width of the trench 60a positioned at the end portion, the edge part on which an electric field concentrated was divided into two parts, dispersing the electric field. This reduced the maximum value of the electric field to 6.9 MV/cm which was equal to or less than the dielectric breakdown electric field strength of gallium oxide. Thus, with this device structure, it is possible to produce a gallium oxide Schottky barrier diode satisfying a required withstand voltage.

Although the electric field concentrated to some extent on the bottom portion of the trench 60 that was not positioned at the end portion, there was no difference between Example 2 and Comparative Example 2 in terms of the value of the electric field, and the maximum value of the electric field was 6.8 MV/cm in both Example 2 and Comparative Example 2.

Example 3

A simulation model of Example 3 having the same structure as that of Example 1 was assumed, in which the width W2 of the trench 60a positioned at the end portion was changed from 1 μm to 20 μm, and the electric field strength obtained upon application of a backward voltage between the anode electrode 40 and the cathode electrode 50 was simulated. The simulation result is illustrated in FIG. 9.

Figure 9:
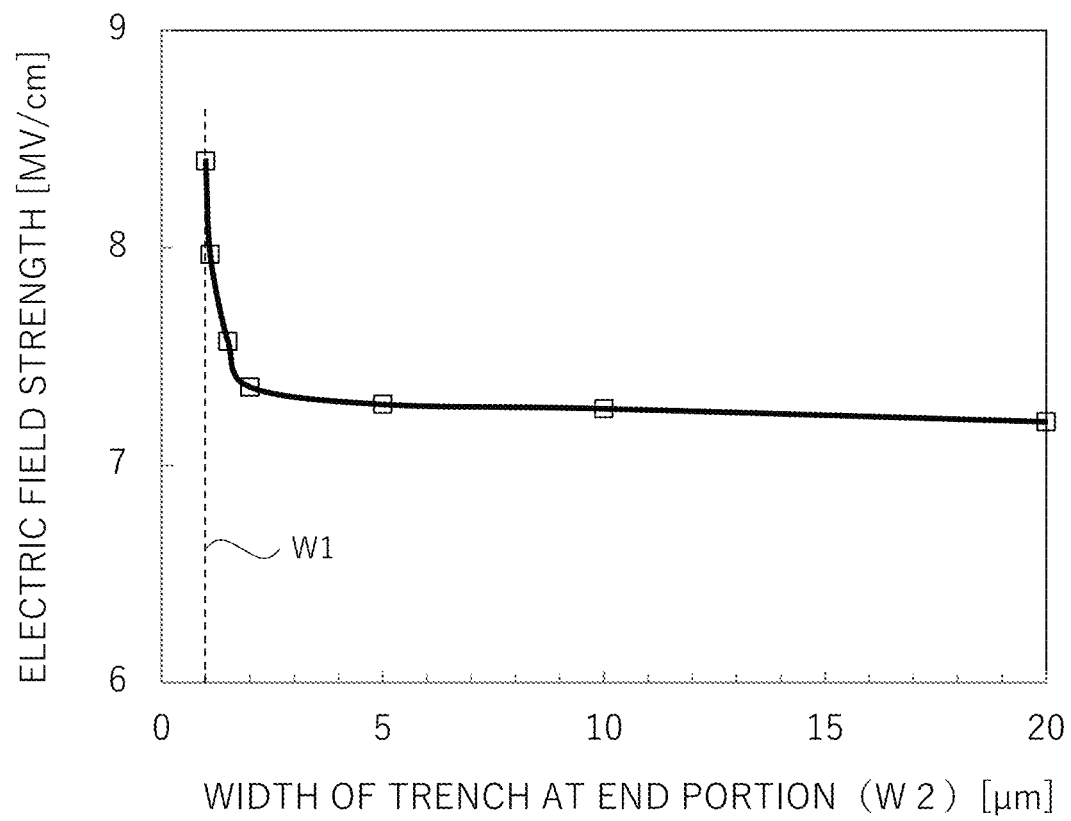
FIG. 9 is a graph indicating a simulation result of Example 3.

As illustrated in FIG. 9, it was found that when the width W2 of the trench 60a positioned at the end portion exceeds 1 μm of the width W1 of the trench 60, that is, when W1<W2 is satisfied, the maximum value of an electric field became equal to or less than 8 MV/cm which is the dielectric breakdown electric field strength of gallium oxide.

REFERENCE SIGNS LIST 20 semiconductor substrate
21 upper surface of semiconductor substrate
22 back surface of semiconductor substrate
30 drift layer
31 upper surface of the drift layer
40 anode electrode
50 cathode electrode
60 trench
60a trench positioned at end portion
61 insulating film
70 insulating layer
71 opening
100, 200 Schottky barrier diode
M mesa region

What is claimed is:

1. A Schottky barrier diode comprising:
a semiconductor substrate made of gallium oxide;
a drift layer made of gallium oxide and provided on the semiconductor substrate;
an anode electrode that is in Schottky contact with the drift layer; and
a cathode electrode that is in ohmic contact with the semiconductor substrate,
wherein the drift layer has a plurality of trenches formed in a position overlapping the anode electrode in a plan view,
wherein the plurality of trenches are filled with electrodes comprising a same material as the anode electrode,
wherein the anode electrode is connected in common to the electrodes,
wherein a trench positioned at a first end among the plurality of trenches has a selectively increased width,
wherein one of the electrodes filling the trench positioned at the first end is greater in width than other electrodes filling trenches other than the trench positioned at the first end, and
wherein the trench positioned at the first end has a curved bottom surface.

2. The Schottky barrier diode as claimed in claim 1, wherein inner walls of the plurality of trenches are respectively covered with insulating films.

3. The Schottky barrier diode as claimed in claim 1, further comprising an insulating layer formed on the drift layer,
wherein the anode electrode is formed on the insulating layer and is in Schottky contact with the drift layer through an opening formed in the insulating layer.

4. The Schottky barrier diode as claimed in claim 2, further comprising an insulating layer formed on the drift layer,
wherein the anode electrode is formed on the insulating layer and is in Schottky contact with the drift layer through an opening formed in the insulating layer.

5. The Schottky barrier diode as claimed in claim 1,
wherein the curved bottom surface of the trench positioned at the first end has a first radius of curvature,
wherein the plurality of the trenches other than the trench positioned at the first end each have a curved bottom surface having a second radius of curvature, and
wherein the first radius of curvature is greater than the second radius of curvature.

6. The Schottky barrier diode as claimed in claim 1,
wherein the drift layer has a surface including:
a first surface in which the plurality of trenches are formed and which is covered with the anode electrode, and
a second surface which is not covered with the anode electrode,
wherein the plurality of trenches are aligned in line with one direction perpendicular to a depth direction of each trench, and
wherein the first surface extends in the one direction from the trench positioned at the first end to another trench positioned at a second end portion opposite the first end.

7. The Schottky barrier diode as claimed in claim 3, wherein the insulating layer does not overlap with any one of the plurality of trenches.

8. A Schottky barrier diode comprising:
a semiconductor substrate having upper and bottom surfaces;
a drift layer having upper and bottom surfaces, the drift layer being disposed on the semiconductor substrate such that the bottom surface of the drift layer is in contact with the upper surface of the semiconductor substrate, the drift layer having a plurality of trenches that open in the upper surface of the drift layer;

an anode electrode that is in Schottky contact with the upper surface of the drift layer; and a cathode electrode that is in ohmic contact with the bottom surface of the semiconductor substrate, wherein each of the semiconductor substrate and the drift layer comprises gallium oxide, wherein the plurality of trenches include a first trench, a second trench, and third trenches arranged between the first trench and the second trench, the plurality of trenches being aligned in line with one direction perpendicular to a depth direction of each trench, wherein the first trench is filled with a first electrode, wherein the second trench is filled with a second electrode, wherein each of the third trenches is filled with a third electrode, wherein the first, second, and third electrodes comprise a same material as the anode electrode, wherein the anode electrode is connected in common to the first, second, and third electrodes, wherein each of the first and second trenches is greater in width than each of the third trenches, wherein each of the first and second electrodes is greater in width than each of the third electrodes, wherein the upper surface of the drift layer has (1) a first surface extending between the first trench and the second trench, and (2) a second surface different from the first surface, and wherein the anode electrode is in Schottky contact with the first surface without covering the second surface.

9. The Schottky barrier diode as claimed in claim 8, wherein the first trench has a first opening in the upper surface of the drift layer, and a part of an edge of the first opening is aligned with an edge of a first side of the anode electrode along the depth direction of the first trench, and wherein the second trench has a second opening in the upper surface of the drift layer, and a part of an edge of the second opening is aligned with an edge of a second side of the anode electrode along a depth direction of the second trench.

10. The Schottky barrier diode as claimed in claim 8, wherein each of the first trench, the second trench, and the third trenches has a curved bottom surface.

11. The Schottky barrier diode as claimed in claim 8, wherein the first trench has a first curved bottom surface having a first radius of curvature, wherein the second trench has a second curved bottom surface having a second radius of curvature, wherein the third trenches each have a third curved bottom surface having a third radius of curvature, and wherein the first radius of curvature and the second radius of curvature are greater than the third radius of curvature.

12. The Schottky barrier diode as claimed in claim 8, wherein a part of the drift layer between two adjacent ones of the third trenches is a mesa region, and wherein the mesa region has a width greater than that of each third trench.

13. A Schottky barrier diode comprising:

a semiconductor substrate having upper and bottom surfaces;

a drift layer having upper and bottom surfaces, the drift layer being disposed on the semiconductor substrate such that the bottom surface of the drift layer is in contact with the upper surface of the semiconductor substrate, the drift layer having a plurality of trenches that open in the upper surface of the drift layer;

an anode electrode that is in Schottky contact with the upper surface of the drift layer;

a cathode electrode that is in ohmic contact with the bottom surface of the semiconductor substrate; and an insulating layer covering the upper surface of the drift layer, wherein each of the semiconductor substrate and the drift layer comprises gallium oxide, wherein the plurality of trenches include a first trench, a second trench, and third trenches arranged between the first and second trenches, the plurality of trenches being aligned in line with one direction perpendicular to a depth direction of each trench, wherein the first trench is filled with a first electrode, wherein the second trench is filled with a second electrode, wherein each of the third trenches is filled with a third electrode, wherein the first, second, and third electrodes comprise a same material as the anode electrode, wherein the anode electrode is connected in common to the first, second, and third electrodes, wherein each of the first and second trenches is greater in width than each of the third trenches, wherein each of the first and second electrodes is greater in width than each of the third electrodes, wherein the upper surface of the drift layer has (1) a first surface extending between the first trench and the second trench, and (2) a second surface different from the first surface, wherein the anode electrode is in Schottky contact with the first surface, and wherein the insulating layer covers the second surface without overlapping with the first and second trenches.

14. The Schottky barrier diode as claimed in claim 13, wherein the first trench has a first opening in the upper surface of the drift layer, and a part of an edge of the first opening is aligned with an edge of a first side of the anode electrode along the depth direction of the first trench, and wherein the second trench has a second opening in the upper surface of the drift layer, and a part of an edge of the second opening is aligned with an edge of a second side of the anode electrode along a depth direction of the second trench.

15. The Schottky barrier diode as claimed in claim 13, wherein each of the first trench, the second trench, and the third trenches has a curved bottom surface.

16. The Schottky barrier diode as claimed in claim 13, wherein the first trench has a first curved bottom surface having a first radius of curvature, wherein the second trench has a second curved bottom surface having a second radius of curvature, wherein the third trenches each have a third curved bottom surface having a third radius of curvature, and wherein the first radius of curvature and the second radius of curvature are greater than the third radius of curvature.

17. The Schottky barrier diode as claimed in claim 13, wherein a part of the drift layer between two adjacent ones of the third trenches is a mesa region, and wherein the mesa region has a width greater than that of each third trench.

18. The Schottky barrier diode as claimed in claim 2, wherein a thickness of the insulating film covering the inner wall of the trench positioned at the first end is a same as a thickness of the insulating film covering the inner wall of the trenches other than the trench positioned at the first end.

19. The Schottky barrier diode as claimed in claim 8,
wherein an inner wall of the first trench is covered with a first insulating film,
wherein an inner wall of the second trench is covered with a second insulating film,
wherein an inner wall of each of the third trenches are covered with a third insulating film, and
wherein thicknesses of the first, second, and third insulating films are a same as one another.

20. The Schottky barrier diode as claimed in claim 13,
wherein an inner wall of the first trench is covered with a first insulating film,
wherein an inner wall of the second trench is covered with a second insulating film,
wherein an inner wall of each of the third trenches are covered with a third insulating film, and
wherein thicknesses of the first, second, and third insulating films are a same as one another.

* * * * *